(12) United States Patent
Leung et al.

(10) Patent No.: US 6,661,090 B1
(45) Date of Patent: Dec. 9, 2003

(54) METAL ADHESION LAYER IN AN INTEGRATED CIRCUIT PACKAGE

(75) Inventors: Omar S. Leung, Palo Alto, CA (US); Josef Berger, Los Altos, CA (US)

(73) Assignee: Silicon Light Machines, Inc., Sunnyvale, CA (US)

( * ) Notice: Subject to any disclaimer, the term of this patent is extended or adjusted under 35 U.S.C. 154(b) by 0 days.

(21) Appl. No.: 10/150,232

(22) Filed: May 17, 2002

(51) Int. Cl.[7] .......................... H01L 23/12; H01L 23/02
(52) U.S. Cl. ..................... 257/704; 257/678; 257/783; 257/710
(58) Field of Search ............................... 257/704, 678, 257/784, 710

(56) References Cited

U.S. PATENT DOCUMENTS

| | | | |
|---|---|---|---|
| 4,356,047 A | 10/1982 | Gordon et al. | |
| 5,414,300 A | 5/1995 | Tozawa et al. | |
| 6,077,726 A | 6/2000 | Mistry et al. | |
| 6,173,489 B1 | 1/2001 | McMahon et al. | |
| 6,303,986 B1 | * 10/2001 | Shook | 257/680 |
| 6,313,521 B1 | * 11/2001 | Baba | 257/678 |

* cited by examiner

Primary Examiner—Jasmine Clark
(74) Attorney, Agent, or Firm—Okamoto & Benedicto LLP

(57) ABSTRACT

In one embodiment, an integrated circuit packaging structure includes a first metal adhesion layer formed under a lid and a second metal adhesion layer formed over a substrate. The lid includes a free surface that may move a small amount without cracking. The second metal adhesion layer is configured such that its outer end does not extend past the free surface of the lid to minimize crack formation.

15 Claims, 6 Drawing Sheets

METAL ADHESION LAYER IN AN INTEGRATED CIRCUIT PACKAGE

BACKGROUND OF THE INVENTION

1. Field of the Invention

The present invention relates generally to integrated circuits, and more particularly to integrated circuit packaging.

2. Description of the Background Art

As is well known, an integrated circuit may be packaged to protect the integrated circuit from mechanical damage and contamination. A packaging process may involve encapsulation of an integrated circuit, deposition of a passivation layer on the integrated circuit, and/or sealing portions of the integrated circuit. For example, an optically transparent lid (e.g., glass) may be formed over a portion of an integrated circuit that is responsive to optical energy, such as light. Such optically transparent lids are employed in UV-erasable EPROM's and imaging devices such as grating light valves, for example. Opaque lids, such as ceramic lids, may also be employed in other applications.

Because a packaging process may involve high temperature heating and flowing of materials, an integrated circuit may be damaged during packaging. For example, a crack may form in the substrate or passivation layer of an integrated circuit after flowing solder on a metal adhesion layer overlying the substrate. The crack may break the integrated circuit or render it unreliable. From the foregoing, a packaging technique that minimizes damage to integrated circuits is highly desirable.

SUMMARY

In one embodiment, an integrated circuit packaging structure includes a first metal adhesion layer formed under a lid and a second metal adhesion layer formed over a substrate. The lid includes a free surface that may move a small amount without cracking. The second metal adhesion layer is configured such that its outer end does not extend past the free surface of the lid to minimize crack formation.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention relates to methods and associated structures for packaging an integrated circuit. The present invention may be used in a variety of packaging-related applications. For example, embodiments of the present invention may be used in forming lids over integrated circuits. The formation of lids over integrated circuits is also disclosed in the commonly-assigned U.S. Pat. No. 6,303,986, filed by James G. Shook on Jul. 29, 1998 (hereinafter "the Shook patent"). The Shook patent is hereby incorporated by reference in its entirety.

Figure 1:
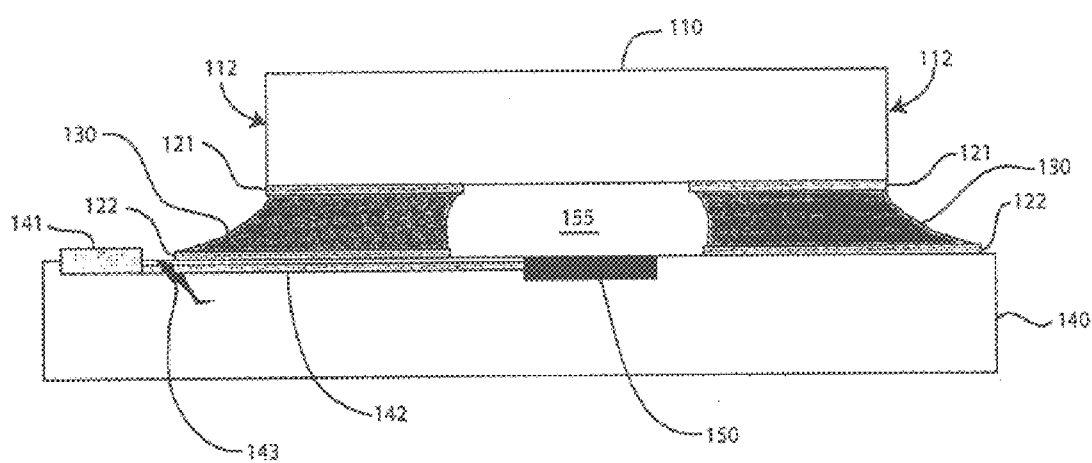
FIG. 1 schematically shows a side cross-sectional view of a packaged integrated circuit.

FIG. 1 schematically shows a side cross-sectional view of a packaged integrated circuit. In the example of FIG. 1, an active device 150 is under a lid 110. Between device 150 and lid 110 is an air gap 155. Device 150 may comprise electrical circuits or micro-electro-mechanical structures for a grating light valve, for example. Grating light valves are disclosed in U.S. Pat. Nos. 5,311,360 and 5,841,579, which are both incorporated herein by reference in their entirety. Lid 110 may be a transparent lid in the case where device 150 is for a grating light valve (or EPROM, etc.), or an opaque lid in applications not requiring optical energy transmission.

Device 150 is in a substrate 140, which may be a silicon substrate. An interconnect line 142 electrically connects device 150 to a bond pad 141. A wire (not shown) may thus be attached to bond pad 141 to couple external electrical signals to device 150.

A solder 130 bonds a top metal adhesion layer 121 and a bottom metal adhesion layer 122. Metal adhesion layers 121 and 122 provide an adhesion surface for solder 130. Note that a metal adhesion layer 121 or 122 may be also be a seal ring. As shown in FIG. 1, metal adhesion layer 121 is formed under lid 110 while metal adhesion layer 122 is formed over substrate 140. A thin passivation layer, such as a layer of silicon nitride (not shown), may be formed between metal adhesion layer 122 and substrate 140.

In the example of FIG. 1, solder 130 slopes towards the sides of lid 110, which are denoted as free surfaces 112. Sloping solder 130 towards a free surface 112 is conventionally thought of as providing a strong bond between metal adhesion layers 121 and 122. Thus, the conventional approach is to make the surface area of a metal adhesion layer 122 larger than or at least equal to that of a metal adhesion layer 121. The inventors discovered, however, that the conventional approach may result in a crack 143 when solder 130 cools down after a high temperature process.

Figure 2A:
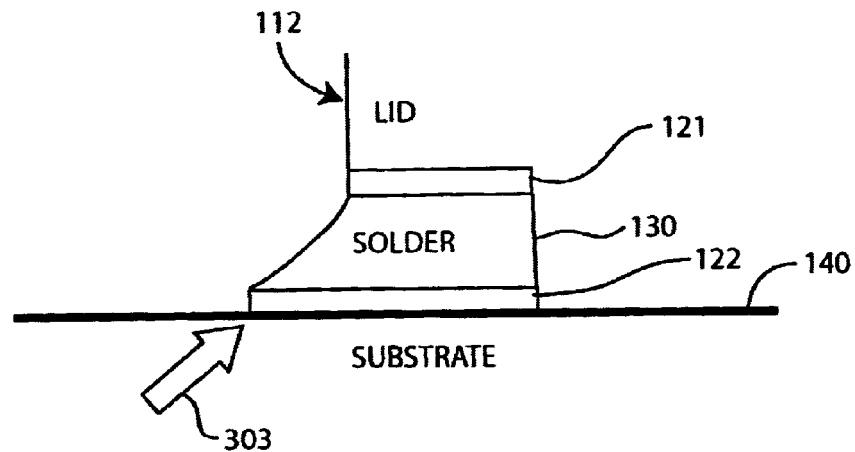
FIG. 2A schematically illustrates a mechanism that the inventors believe causes crack formation.

FIG. 2A schematically illustrates the mechanism that the inventors believe causes a crack 143 to form. After a high temperature process, solder 130 cools down and begins to shrink. As solder 130 shrinks, tensile stress develops on the end of metal adhesion layer 122 pointed to by arrow 303. In other words, as solder 130 shrinks, it tends to pull on metal adhesion layer 122 in the direction indicated by arrow 303. Depending on how much solder 130 shrinks, a crack 143 may result as shown in FIG. 1.

Figure 2B:
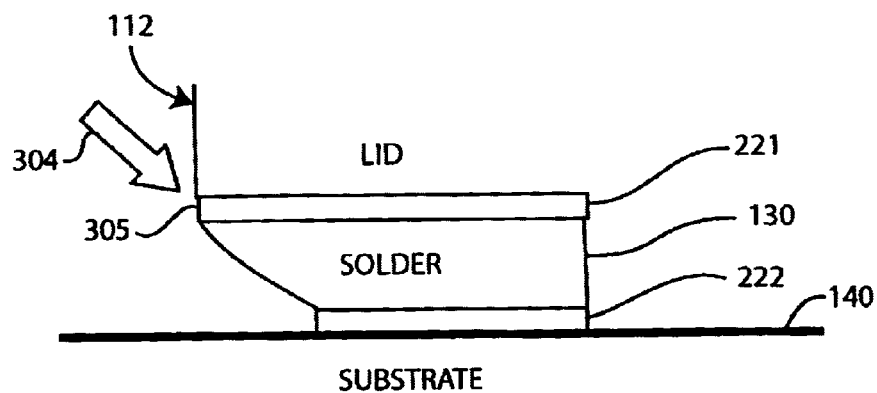
FIG. 2B schematically illustrates a mechanism that the inventors believe helps prevent crack formation.
Figure 3:
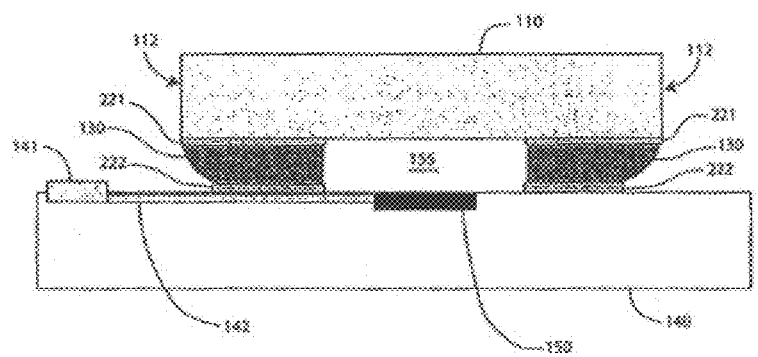
FIG. 3 schematically shows a side cross-sectional view of a packaged integrated circuit in accordance with an embodiment of the present invention.

FIG. 3 schematically shows a side cross-sectional view of a packaged integrated circuit in accordance with an embodiment of the present invention. FIG. 3 is similar to FIG. 1 except for the configuration of a top metal adhesion layer 221 and a bottom metal adhesion layer 222. In the example of FIG. 3, metal adhesion layer 222 is configured such that its outer end (i.e., the end closest to a free surface 112) does not extend past the outer end of metal adhesion layer 221. As will be explained below in connection with FIG. 2B, this helps prevent cracks from forming.

FIG. 2B schematically illustrates the mechanism that the inventors believe helps prevent a crack 143 from forming. As solder 130 shrinks after subjecting it to high temperatures, tensile stress develops on an outer end 305 of a metal adhesion layer 221. Thus, as solder 130 shrinks, solder 130 pulls on outer end 305 in the direction indicated by an arrow 304. Unlike substrate 140, however, free surface 112 may move a small amount without cracking.

Note that free surface 112 is not a totally free surface because it is part of a lid that is soldered to substrate 140. However, free surface 112 is "free" considering the range of movement allowed of free surface 112 as compared to that of substrate 140. For example, a glass lid may be flexed 1–3 microns without cracking, whereas a silicon substrate may develop a crack if flexed more than 1 micron.

As can be appreciated from the foregoing, it is advantageous to configure two metal adhesion layers such that a solder formed between them will tend to pull more on a free surface (e.g., sides of a lid) rather than on a fixed surface (e.g., a substrate). One way of doing so is to make the surface area of a bottom metal adhesion layer smaller than that of a corresponding top metal adhesion layer. If a top metal adhesion layer extends all the way to a free surface, a corresponding bottom metal layer may also be disposed such that it does not extend past the free surface.

Figure 4A:
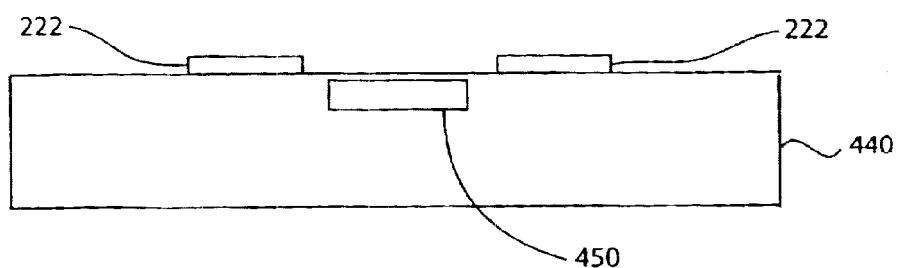
FIGS. 4(a)–4(d) schematically show side cross-sectional views of an integrated circuit being packaged in accordance with an embodiment of the present invention.

FIGS. 4(a)–4(d) schematically show side cross-sectional views of an integrated circuit being packaged in accordance with an embodiment of the present invention. In FIG. 4(a), a metal adhesion layer 222 is deposited over a substrate 440. Note that metal adhesion layer 222 may have a rectangular shape as shown in the plan view of FIG. 5. Substrate 440 may include an active device 450 comprising electrical circuits or micro-electro-mechanical structures, for example. Other well known details such as interconnect lines, bond pads, and passivation layers (e.g., thin silicon nitride layer on substrate 440) are not shown in FIG. 4(a) for clarity of illustration.

A metal adhesion layer 222 may comprise one or more layers of materials. For example, a metal adhesion layer 222 may be a metal stack (not shown) comprising a 300 angstroms thick layer of titanium formed over substrate 440, a 1000 angstroms thick layer of nickel formed on the layer of titanium, and 1000 angstroms thick layer of platinum formed on the layer of nickel. In one embodiment, a metal adhesion layer 222 is formed using conventional lift off techniques.

Figure 4B:
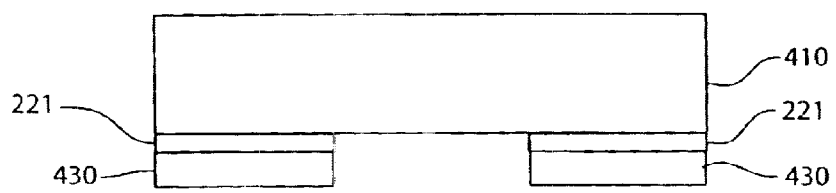
Figure 5:
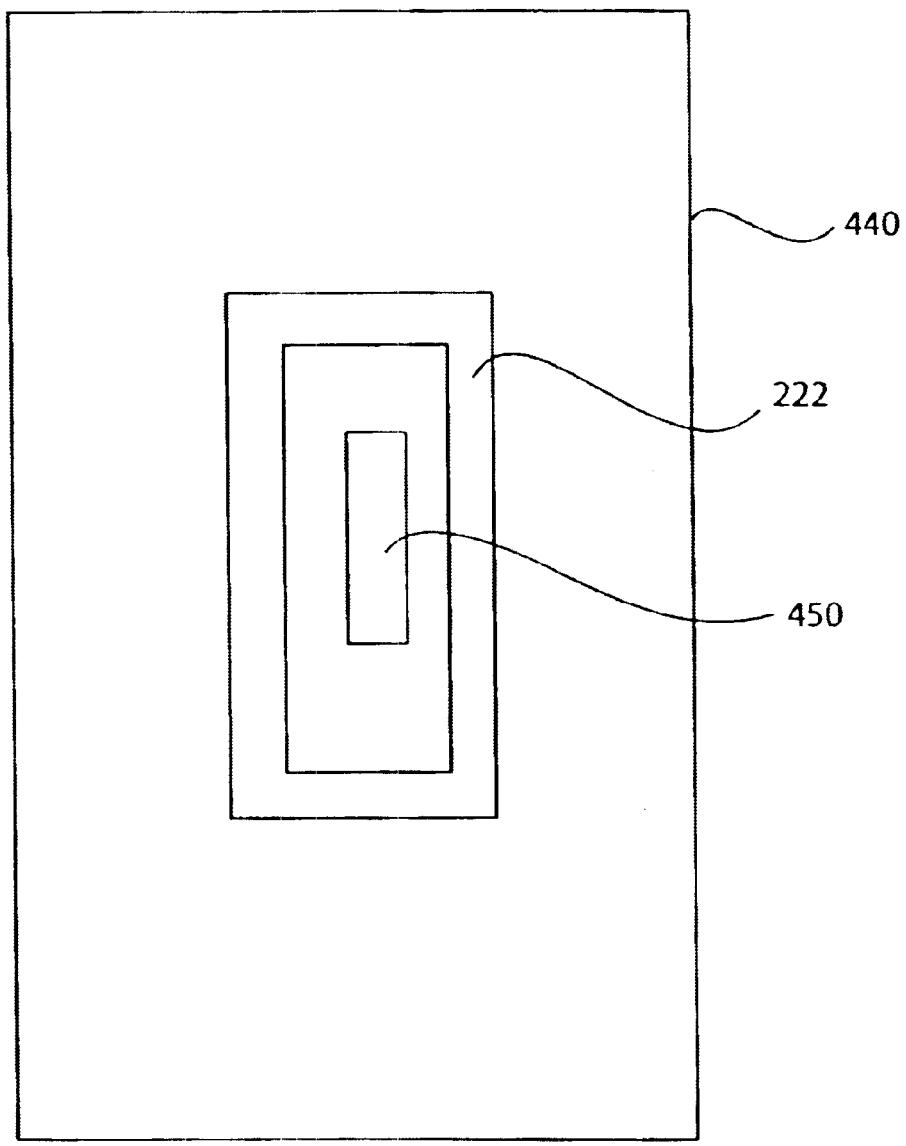
FIG. 5 schematically shows a plan view of FIG. 4(a).

In FIG. 4(b), a metal adhesion layer 221 is formed under a lid 410. Lid 410 may be a transparent lid (e.g., glass) or opaque lid (e.g., ceramic) depending on the application. A metal adhesion layer 221 may comprise one or more layers of materials. For example, a metal adhesion layer 221 may be a metal stack (not shown) comprising a 300 angstroms thick layer of chrome formed on lid 410, a 500 angstroms thick layer of nickel formed on the layer of chrome, and a 1,000 angstroms thick layer of gold formed on the layer of nickel. As another example, a metal adhesion layer 221 may comprise a 300 angstroms thick layer of chrome formed on lid 410, and a 1,000 angstroms thick layer of gold formed on the layer of chrome. Conventional lift off techniques may be used to form metal adhesion layer 221.

Also in FIG. 4(b), a solder 430 is formed on metal adhesion layer 221. In one embodiment, solder 430 is 50 microns thick. The composition of solder 430 may vary depending on implementation. For example, solder 430 may comprise 80% gold and 20% tin. Solder 430 may also comprise 10% gold and 90% tin. Note that solder 430 may also be formed on metal adhesion layer 222 instead of on metal adhesion layer 221. Solder 430 may also be a preformed solder placed between metal adhesion layers 221 and 222 prior to flowing solder 430 by heating it in a process chamber. Like metal adhesion layer 222, solder 430 and metal adhesion layer 221 may also have a rectangular shape.

Figure 4C:
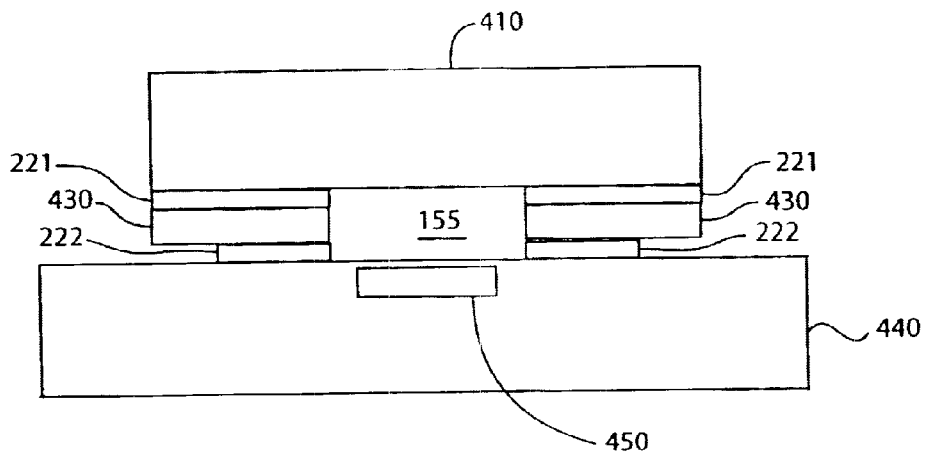

In FIG. 4(c), the sample of FIG. 4(b) is positioned over the sample of FIG. 4(a). As shown in FIG. 4(c), metal adhesion layer 222 is configured such that its outer end does not extend past the outer end of metal adhesion layer 221. In one embodiment, metal adhesion layer 222 is 800 microns wide, while metal adhesion layer 221 is 1000 microns wide.

Figure 4D:
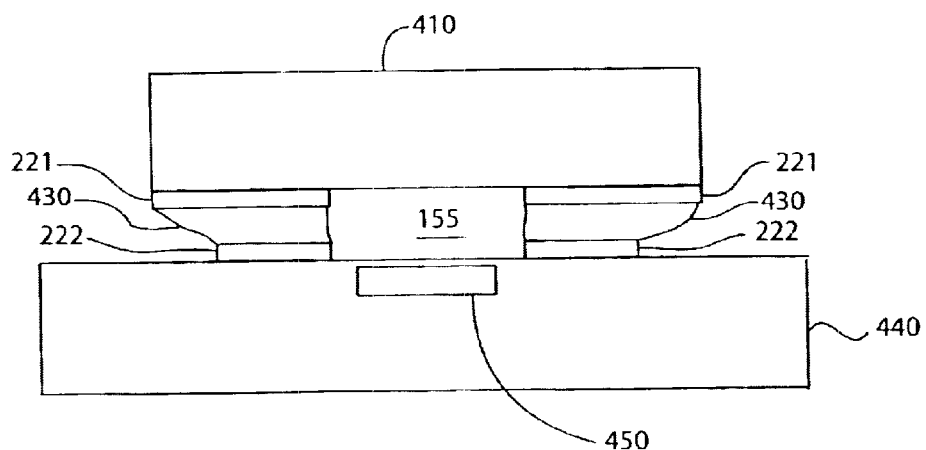

In FIG. 4(d), the sample of FIG. 4(c) is heated to melt and flow solder 430. This results in metal adhesion layer 221 being bonded to metal adhesion layer 222. An air gap 155 is also formed between device 450 and lid 410. The height of air gap 155 may vary depending on implementation. For example, air gap 155 may be 50 or 100 microns high.

The Shook patent, which is incorporated herein by reference in its entirety, discloses a suitable way of flowing a solder to obtain a hermetic seal. The Shook patent also discloses specific process steps that may be applicable to the present invention. It is to be noted, however, that other fabrication steps may also be employed without detracting from the merits of the present invention.

While specific embodiments of the present invention have been provided, it is to be understood that these embodiments are for illustration purposes and not limiting. Many additional embodiments will be apparent to persons of ordinary skill in the art reading this disclosure. For example, while the above described embodiments show top and bottom metal adhesion layers, the present invention may also be employed in applications where the metal adhesion layers are side by side. Thus, the present invention is limited only by the following claims.

What is claimed is:

1. An integrated circuit packaging structure comprising:
   a first metal adhesion layer having an outer end, the first metal adhesion layer being under a lid having a free surface; and
   a second metal adhesion layer under the first metal adhesion layer, the second metal adhesion layer having an outer end, wherein the outer end of the first metal adhesion layer extends past the outer end of the second metal adhesion layer.

2. The integrated circuit packaging structure of claim 1 further comprising:
   a solder bonding the first metal adhesion layer to the second metal adhesion layer.

3. The integrated circuit packaging structure of claim 1 wherein the first metal adhesion layer is wider than the second metal adhesion layer.

4. The integrated circuit packaging structure of claim 1 wherein the outer end of the second metal adhesion layer does not extend past the free surface of the lid.

5. The integrated circuit packaging structure of claim 1 wherein the lid comprises an optically transparent lid.

6. The integrated circuit packaging structure of claim 1 wherein the lid comprises an optically opaque lid.

7. The integrated circuit packaging structure of claim 1 further comprising a device under the lid.

8. The integrated circuit packaging structure of claim 7 further comprising an air gap between the device and the lid.

9. An integrated circuit packaging structure comprising:
- a first adhesion means for providing a first adhesion surface, the first adhesion means being disposed under a free surface;
- a second adhesion means for providing a second adhesion surface, the second adhesion means being under the first adhesion means; and
- means for bonding the first adhesion means and the second adhesion means such than an outer end of the first adhesion means extends past an outer end of the second adhesion means.

10. The integrated circuit packaging structure of claim 9 wherein the first adhesion means comprises a metal adhesion surface formed under a lid.

11. The integrated circuit packaging structure of claim 9 wherein the free surface is an end surface of a lid.

12. The integrated circuit packaging structure of claim 11 wherein the lid comprises a transparent lid.

13. The integrated circuit packaging structure of claim 11 wherein the lid comprises an opaque lid.

14. The integrated circuit packaging structure of claim 11 further comprising a device under the lid.

15. The integrated circuit packaging structure of claim 11 further comprising an air gap between the lid and a device.

* * * * *